(12) United States Patent
Park

(10) Patent No.: US 8,779,446 B2
(45) Date of Patent: Jul. 15, 2014

(54) LIGHT EMITTING DEVICE PACKAGE AND LIGHT EMITTING SYSTEM

(75) Inventor: Sung Ho Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 118 days.

(21) Appl. No.: 13/464,571

(22) Filed: May 4, 2012

(65) Prior Publication Data

US 2013/0026502 A1  Jan. 31, 2013

(30) Foreign Application Priority Data

Jul. 29, 2011 (KR) .......................... 10-2011-0076161

(51) Int. Cl.
*H01L 23/10* (2006.01)

(52) U.S. Cl.
USPC .................... 257/88; 257/98; 438/27; 438/28

(58) Field of Classification Search
USPC ......... 257/88, 98, E33.059, E33.061; 438/27, 438/28
See application file for complete search history.

(56) References Cited

U.S. PATENT DOCUMENTS

| | | | |
|---|---|---|---|
| 2003/0141813 A1* | 7/2003 | Miyashita | 313/512 |
| 2005/0093146 A1* | 5/2005 | Sakano | 257/730 |
| 2010/0207521 A1* | 8/2010 | Tamaki et al. | 313/506 |
| 2011/0180832 A1* | 7/2011 | Kim | 257/98 |

* cited by examiner

*Primary Examiner* — George Fourson, III
(74) *Attorney, Agent, or Firm* — Birch, Stewart, Kolasch & Birch, LLP

(57) ABSTRACT

A light emitting device package according to the embodiment includes a body having a cavity; at least one light emitting device in the cavity; a resin member filled in the cavity while covering the light emitting device; and a fluorescence sheet coupled with a top surface of the body such that the fluorescence sheet is physically separable from the top surface of the body, and including a fluorescence material for converting light emitted from the light emitting device into another light.

20 Claims, 8 Drawing Sheets

LIGHT EMITTING DEVICE PACKAGE AND LIGHT EMITTING SYSTEM

BACKGROUND

A light emitting diode (LED) may constitute a light emitting source by using GaAs, AlGaAs, GaN, InGaN, and InGaAlP-based compound semiconductor materials.

Such an LED is packaged so as to be used as a light emitting device package that emits lights having various colors. The light emitting device package is used as a light source in various products such as a lighting indicator to represent color, a character indicator, and an image display.

SUMMARY

The embodiment provides a light emitting device package having a novel structure.

The embodiment provides a light emitting device package capable of correcting chromaticity coordinates.

A light emitting device package according to the embodiment includes a body having a cavity, at least one light emitting device in the cavity, a resin member filled in the cavity while covering the light emitting device, and a fluorescence sheet including a fluorescence material for converting light emitted from the light emitting device into another light.

According to the embodiment, the fluorescence sheet including the fluorescence material is formed on the body such that the fluorescence sheet can be easily exchanged, so that the chromaticity coordinate can be corrected by exchanging the fluorescence sheet when the error of the chromaticity coordinate deviates from a predetermined range. Since only the fluorescence sheet is exchanged without exchanging the light emitting device package, the product yield can be improved and the assembling work can be simplified.

DETAILED DESCRIPTION OF THE EMBODIMENTS

Figure 1:
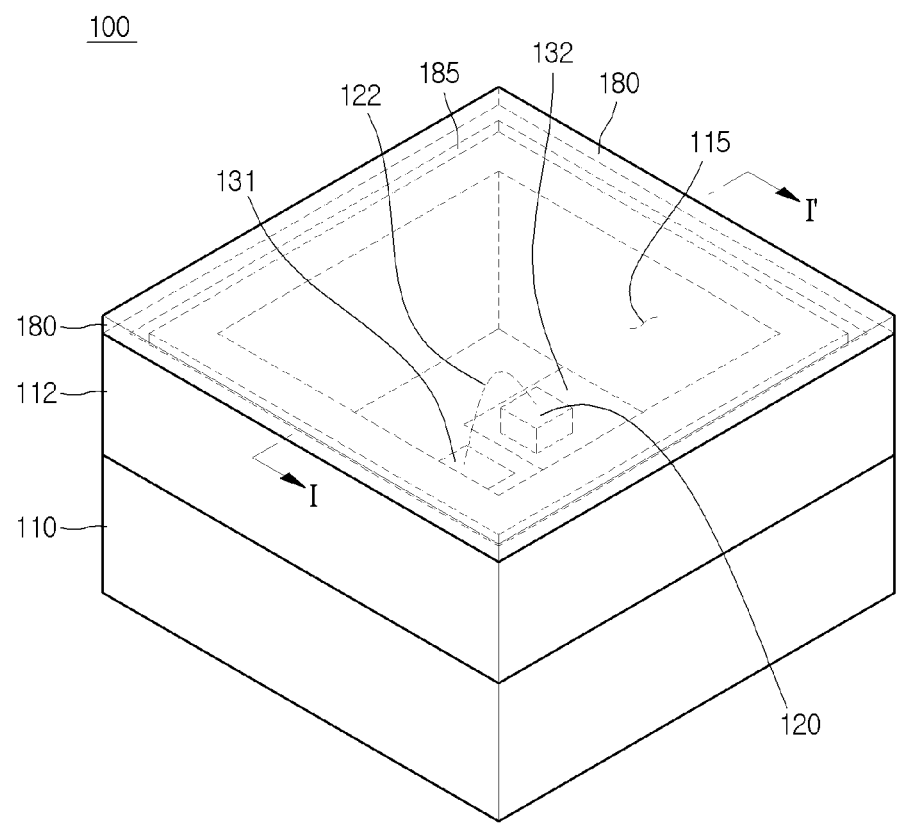
FIG. 1 is a perspective view showing a light emitting device package according to the first embodiment.

In the following description, the embodiments of the disclosure will be described in detail to the extent that those skilled in the art can readily perform the embodiments. However, the disclosure may have various modifications, and is not limited to the following embodiments.

Throughout the whole specification, when a predetermined part "includes" a predetermined component, this does not mean the exclusion of other components, but means the additional inclusion of other components.

The thickness and size of each layer shown in the drawings may be exaggerated, omitted or schematically drawn for the purpose of convenience or clarity. In addition, the size of elements does not utterly reflect an actual size. The same reference numbers will be assigned to the same elements.

In the description of the embodiments, it will be understood that when a layer, a film, a region, or a plate is referred to as being "on" or "under" another part, it can be "directly" or "indirectly" over another part or one or more intervening layers may also be present. In contrast, if a part is referred to as being "directly on" another part, intervening layers may not be present.

Hereinafter, a light emitting device package according to the first embodiment will be described with reference to FIGS. 1 to 3.

Figure 2:
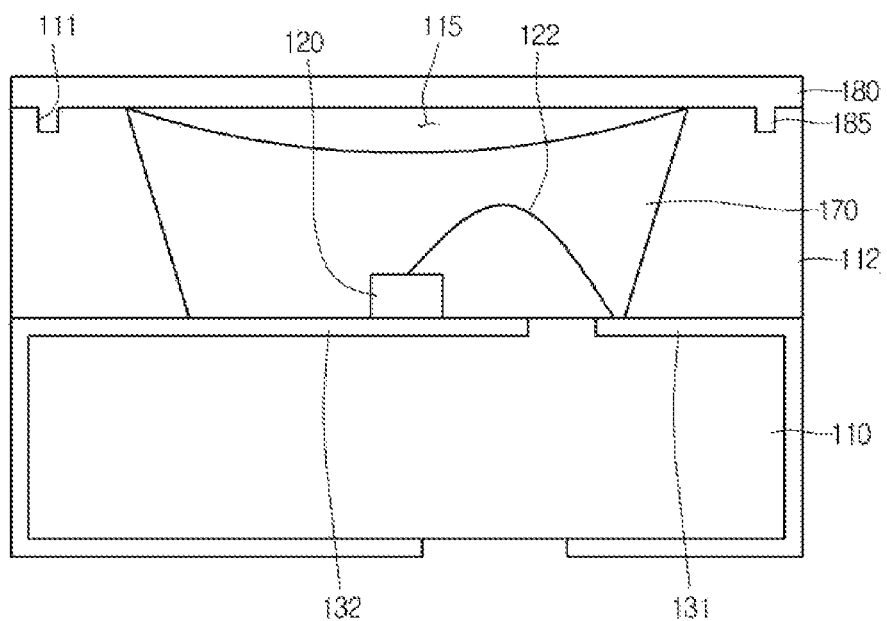
FIG. 2 is a sectional view taken along line I-I' of the light emitting device package shown in FIG. 1.
Figure 3:
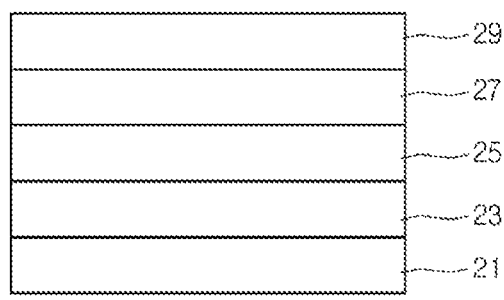
FIG. 3 is a sectional view showing the light emitting diode of FIG. 1.

FIG. 1 is a perspective view showing the light emitting device package 100 according to the first embodiment, FIG. 2 is a sectional view taken along line I-I' of the light emitting device package 100 shown in FIG. 1, and FIG. 3 is a sectional view showing a light emitting diode of FIG. 1.

Referring to FIGS. 1 to 3, the light emitting device package 100 includes a body 110, at least one light emitting device 120 provided on the body 110, and first and second electrodes 131 and 132 provided on the body 110 and electrically connected to the light emitting device 120.

In addition, the light emitting device package 100 includes a resin member 170 to protect the light emitting device 120 and a fluorescence sheet 180.

The body 110 may include at least one of resin material, such as polyphthalamide (PPA), silicon (Si), metallic material, photosensitive glass (PSG), sapphire ($Al_2O_3$), and a printed circuit board (PCB). Preferably, the body 110 may include the resin material such as PSG.

The body 110 may include a conductor having electrical conductivity. If the body 110 includes the conductor having electrical conductivity, an insulating layer (not shown) may be formed on the surface of the body 110 to prevent the body 110 from being electrically shorted with the first and second electrodes 131 and 132. When viewed in a plan view, the body 110 may have various shapes such as a triangular shape, a rectangular shape, a polygonal shape, and a circular shape according to the use and the design of the light emitting device package 100.

A cavity 115 may be formed in the body 112 such that an upper portion 112 of the body 110 can be open. For example, the cavity 115 may be formed through injection-molding or etching.

The cavity 115 may have the shape of a cup or a concave vessel. The inner lateral side of the cavity 115 may be perpendicular or inclined to a bottom surface of the cavity 115. If the inclined surface is formed by performing a wet etching process with respect to the body 110, the inclined surface may have an inclination angle of about 50° to about 60°.

In addition, when viewed in a plan view, the cavity 115 may have a circular shape, a rectangular shape, a polygonal shape, or an oval shape.

The first and second electrodes 131 and 132 may be formed on the body 110. The first and second electrodes 131 and 132 may be electrically divided into an anode and a cathode to supply power to the light emitting device 120. Meanwhile, in addition to the first and second electrodes 131 and 132, a plurality of electrodes may be formed on the body 110 according to the design of the light emitting device 120, but the embodiment is not limited thereto.

Meanwhile, the first and second electrodes 131 and 132 are separated from each other and exposed in the cavity 115. As shown in FIG. 2, the first and second electrodes 131 and 132 may extend to a rear surface of the body 110 while surrounding the lateral side of the body 110, but the embodiment is not limited thereto.

The first and second electrodes 131 and 132 may be formed in a multi-layer structure. For example, the first and second electrodes 131 and 132 may include a Ti/Cu/Ni/Au layer formed by sequentially laminating titanium (Ti), copper (Cu), nickel (Ni), and gold (Au), but the embodiment is not limited thereto.

In other words, material, such as Ti, Cr, or Ta, representing superior adhesive strength with respect to the body is laminated on the lowermost layer of the first and second electrodes 131 and 132, material, such as Au, which is readily attached to a wire and the like and represents superior electrical conductivity, is laminated on the uppermost layer of the first and second electrodes 131 and 132, and a diffusion barrier layer including platinum (Pt), nickel (Ni), or copper (Cu) is laminated between the uppermost layer and the lowermost layer of the first and second electrodes 131 and 132. However, the embodiment is not limited thereto.

The first and second electrodes 131 and 132 may be selectively formed through a plating scheme, a deposition scheme, or photolithography, but the embodiment is not limited thereto.

In addition, a wire 122 serving as a conductive connection member is attached to the first and second electrodes 131 and 132, so that the first and second electrodes 131 and 132 can be electrically connected to the light emitting device 120.

Meanwhile, as shown in FIGS. 1 and 2, a cathode mark may be formed on the body 110 in order to distinguish the first and second electrodes 131 and 132 from each other. However, the embodiment is not limited thereto.

A reflective layer (not shown) may be formed on the first and second electrodes 131 and 132 on the body 110.

The light emitting device 120 may be mounted on the body 110. If the body 110 includes the cavity 115, the light emitting device 120 may be mounted in the cavity 115.

At least one light emitting device 120 may be provided on the body 110 according to the design of the light emitting device package 100. If a plurality of light emitting devices 120 are mounted on the body 120, a plurality of electrodes may be formed to supply power to the light emitting device packages 100, but the embodiment is not limited thereto.

The light emitting device 120 may be directly mounted on the body 110, or electrically bonded onto the first and second electrodes 131 and 132.

The light emitting device 120 may be mounted by selectively using a wire bonding scheme, a die bonding scheme, or a flip bonding scheme. The bonding scheme may vary according to the types of a chip and the positions of electrodes of the chip.

The light emitting device 120 may selectively include a semiconductor light emitting device manufactured by using group III-V compound semiconductors, such as AlInGaN, InGaN, GaN, GaAs, InGaP, AlInGaP, InP, and InGaAs.

As shown in FIG. 2, the light emitting device 120 may be attached to the second electrode 132 by using a conductive adhesive, and may be electrically connected to the first electrode 131 through the wire 122.

The light emitting device 120 is referred to as a vertical light emitting device including a conductive support substrate 21, a bonding layer 23, a second conductive semiconductor layer 25, an active layer 27, and a first conductive semiconductor layer 29 as shown in FIG. 3.

The conductive support substrate 21 may include metal or an electrical conductive semiconductor substrate.

A group III-V nitride semiconductor layer is formed on the conductive support substrate 21 by semiconductor growth equipment, such as an E-beam evaporator, PVD (physical vapor deposition) equipment, CVD (chemical vapor deposition) equipment, PLD (plasma laser deposition) equipment, a dual-type thermal evaporator, sputtering equipment, or MOCVD (metal organic chemical vapor deposition) equipment, but the embodiment is not limited thereto.

The bonding layer 23 may be formed on the conductive support substrate 21. The bonding layer 23 bonds the conductive support substrate 21 with a nitride semiconductor layer. In addition, the conductive support substrate 21 may be formed through a plating scheme instead of a bonding scheme. In this case, the bonding layer 23 may be omitted.

The second conductive semiconductor layer 25 may be formed on the bonding layer 23. The second conductive semiconductor layer 25 may be electrically connected to the first electrode 31.

The second conductive semiconductor layer 25 may include a group III-V compound semiconductor. For example, the second conductive semiconductor layer 25 may include at least one selected from the group consisting of GaN, InN, AlN, InGaN, AlGaN, InAlGaN, and AlInN. The second conductive semiconductor layer 25 may be doped with second conductive dopants, such as Mg, Zn, Ca, Sr, and Ba.

The second conductive semiconductor layer 25 may be prepared as a P type GaN layer having a predetermined thickness by supplying gas including P type dopants, such as $NH_3$, TMGa (or TEGa), or Mg.

The second conductive semiconductor layer 25 includes a current spreading structure at a predetermined region thereof. The current spreading structure includes semiconductor layers in which a current spreading speed in a horizontal direction is faster than a current spreading speed in a vertical direction.

For example, the current spreading structure may include semiconductor layers having difference in concentration of dopants or the conductivity of the dopants.

The second conductive semiconductor layer 25 may supply carriers, which are uniformly spread, to another layer formed thereon, for example, the active layer 27.

The active layer 27 is formed on the second conductive semiconductor layer 25. The active layer 27 has a single quantum well structure (SQW) or a multi-quantum well structure (MQW). The active layer 27 may selectively include an InGaN/GaN stack structure, an AlGaN/InGaN stack structure, an InGaN/InGaN stack structure, or an AlGaN/GaN stack structure.

A second conductive clad layer (not shown) may be formed between the second conductive semiconductor layer 25 and the active layer 27. The second conductive clad layer may include a P type GaN semiconductor. The second conductive clad layer may include a material having an energy bandgap higher than that of the well layer.

The first conductive semiconductor layer 29 is formed on the active layer 27. The first conductive semiconductor layer 29 may include an N type semiconductor layer doped with first conductive dopants. The N type semiconductor layer may include one of compound semiconductors such as GaN, InN, AlN, InGaN, AlGaN, InAlGaN, and AlInN. The first conductive dopant is an N type dopant and at least one of Si, Ge, Sn, Se, and Te can be added as the first conductive dopant.

The first conductive semiconductor layer 29 may include an N type GaN layer having a predetermined thickness by supplying gas including an N type dopant, such as NH3, TMGa (or TEGa), or Si.

In addition, the second conductive semiconductor layer 25 may include a P type semiconductor layer, and the first conductive semiconductor layer 29 may include an N type semiconductor layer. A light emitting structure may include one of an N—P junction structure, a P—N junction structure, an N—P—N junction structure, and a P—N—P junction structure. The following description will be made on the assumption that the uppermost layer of the semiconductor layer is the first conductive semiconductor layer 29.

The first electrode 131 and/or an electrode layer (not shown) may be formed on the first conductive semiconductor layer 29. The electrode layer may include an oxide or nitride-based transmissive layer. For example, the electrode layer may include one selected from the group consisting of ITO (indium tin oxide), ITON (indium tin oxide nitride), IZO (indium zinc oxide), IZON (indium zinc oxide nitride), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, and NiO. The electrode layer may serve as a current spreading layer capable of spreading a current.

In addition, the electrode layer may include a reflective electrode layer. The reflective electrode layer may include a material selected from the group consisting of Ag, Ni, Al, Rh, Pd, Ir, Ru, Mg, Zn, Pt, Au, Hf, and the selective combination thereof. The first electrode may include a metallic layer having a single layer structure or a multiple layer structure. For example, the metallic layer may include at least one selected from the group consisting of Ag, Ni, Al, Rh, Pd, Ir, Ru, Mg, Zn, Pt, Au, and Hf, or the alloy thereof.

A plurality of the light emitting devices 120 may be mounted on the body 110.

In addition, the resin member 170 is formed in the cavity 115 such that the cavity 115 is filled with the resin member 170.

The resin member 170 includes transmissive resin and extends to the upper portion of the body 110.

A depth of the resin member 170 may become shallow from the outer peripheral region to the center region thereof. Thus, a space may be formed between the fluorescence sheet 180 and the resin member 170.

The space may have a size in the range of 50 μm to 60 μm in maximum.

The fluorescence sheet 180 is formed on the resin member 170 over the top surface of the body 110.

The fluorescence sheet 180 may have a thickness in the range of 80 μm to 100 μm. The fluorescence sheet 180 has a structure in which fluorescence materials are distributed in transmissive resin. The fluorescence materials change the wavelength of light emitted from the light emitting device 120 to emit light having a wavelength different from a wavelength of the light emitted from the light emitting device 120.

Therefore, the light emitted from the light emitting device 120 is mixed with the light emitted from the fluorescence material, so that the light having a specific chromaticity coordinate may be generated. If the chromaticity coordinate coincides with the target coordinate, a product is regarded as a normal product.

For example, when the light emitting device 120 is a blue light emitting diode, and the fluorescence material represents a yellow color, the yellow fluorescence material is excited by the blue light to generate white light. When the light emitting device 120 irradiates an ultraviolet ray, fluorescence materials representing three colors of red, green, and blue are added to the fluorescence sheet 180 to generate white light.

The fluorescence sheet 180 may include a sheet protrusion 185 protruding toward the top surface of the body 110 and the body 110 is formed on the top surface thereof with a protrusion slot 111 coupled with the sheet protrusion 185.

The protrusion slot 111 may have a depth in the range of 30 μm to 50 μm.

Referring to FIG. 2, the sheet protrusion 185 and the protrusion slot 111 have the shape corresponding to the shape of the body 110 and surround over the whole area of the body 110. Thus, if the body 110 has a rectangular shape, the sheet protrusion 185 and the protrusion slot 111 may form a rectangular closed loop. However, according to another embodiment, a plurality of sheet protrusions 185 separated from each other and a plurality of protrusion slots 111 to receive the sheet protrusions 185 can be provided.

The fluorescence sheet 180 may include elastic resin and may be coupled with the body 110 as the sheet protrusion 185 is fitted into the protrusion slot 111.

In this manner, since the fluorescence sheet 180 can be fitted into the body 110 in such a manner that the fluorescence sheet 180 can be separated from the body 110, if it is determined in the chromaticity coordinate test that the chromaticity coordinate deviates from the predetermined range, the chromaticity coordinate can be corrected by replacing the fluorescence sheet 180 with another fluorescence sheet 180.

Hereinafter, the coupling scheme between the fluorescence sheet 180 and the body will be described with reference to FIGS. 4 and 5.

Figure 4:
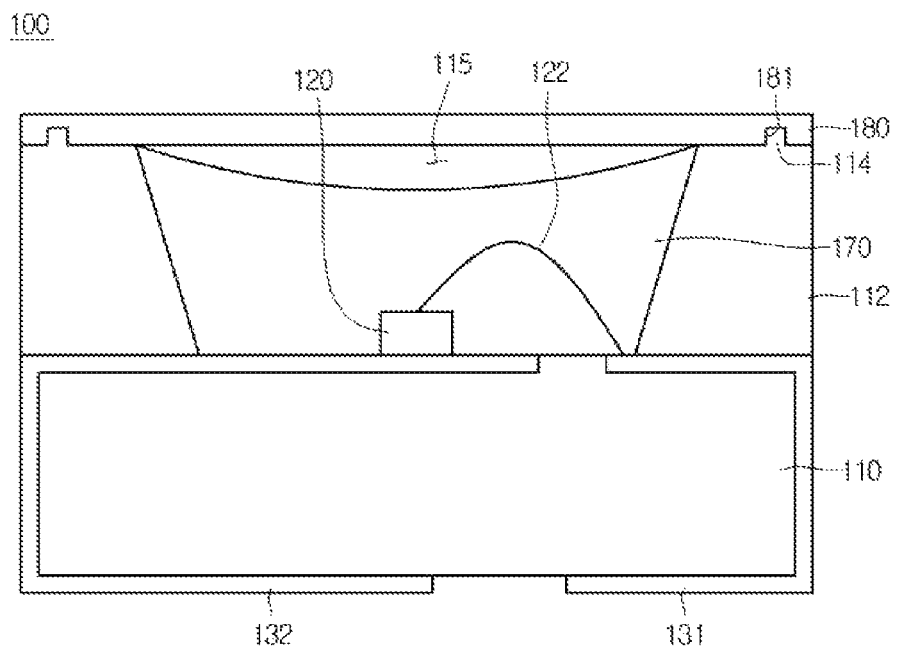
FIG. 4 is a sectional view showing a light emitting device package according to the second embodiment.

Referring to FIG. 4, a light emitting device package 100 according to another embodiment includes a coupling protrusion 114 formed on the top surface of the body 110 and a coupling hole 181 formed in the fluorescence sheet 180 corresponding to the coupling protrusion 114.

The coupling protrusion 114 and the coupling protrusion 114 may form the closed loop along the body 110 as shown in FIG. 1 or a plurality of coupling protrusion 114 separated from each other may be provided.

Figure 5:
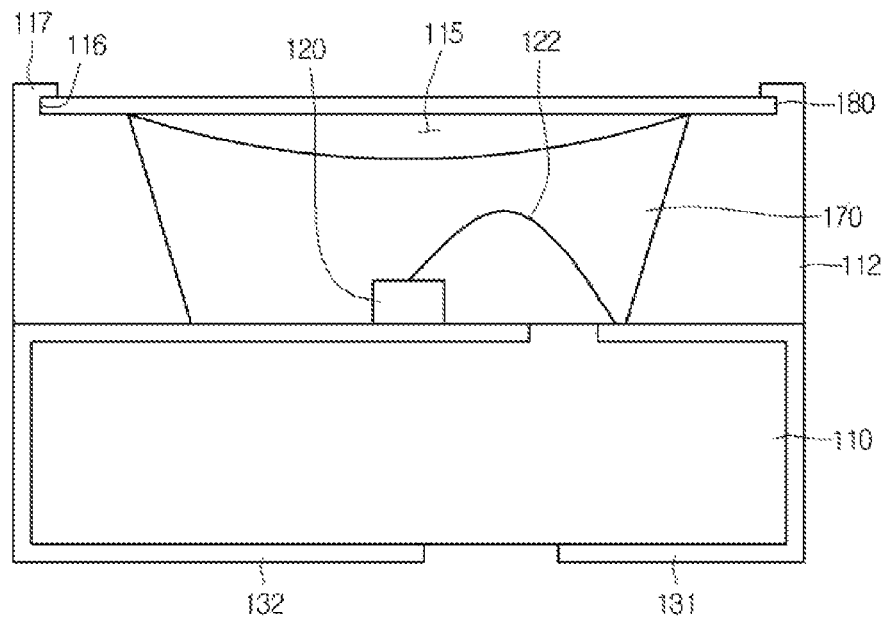
FIG. 5 is a sectional view showing a light emitting device package according to the third embodiment.

Referring to FIG. 5, fixing parts 117 are formed along an outer peripheral region of the top surface of the body 110.

The fixing parts 117 may be formed at two opposite lateral sides of the body 110 and slots 116 are formed beneath the fixing parts 117, respectively.

The fluorescence sheet 180 is slidably coupled into the slots 116 of the fixing parts 117 formed at two opposite lateral sides of the body 110, so that the fluorescence sheet 180 can be fixedly coupled with the body 110.

A height of the slot 116 of the fixing part 117 is the same as the thickness of the fluorescence sheet 180, so that the coupling state between the fluorescence sheet 180 and the body 110 can be maintained.

Hereinafter, another embodiment will be described with reference to FIGS. 6 and 7.

Figure 6:
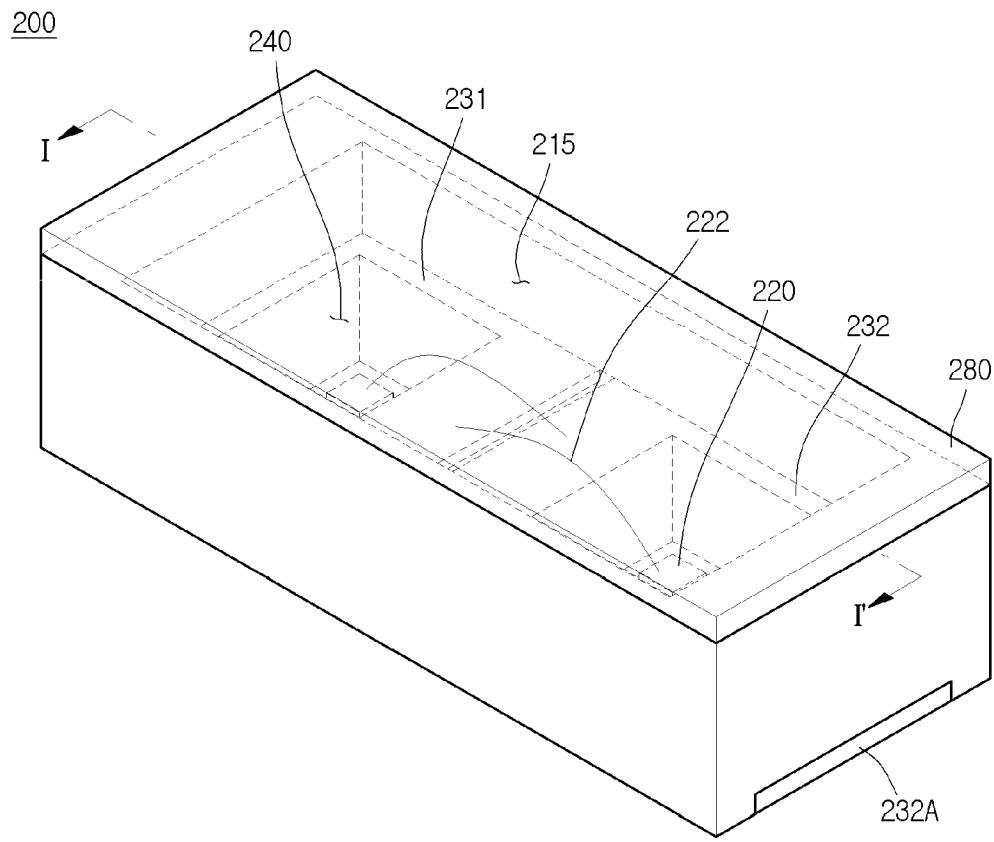
FIG. 6 is a perspective view showing a light emitting device package according to the fourth embodiment.
Figure 7:
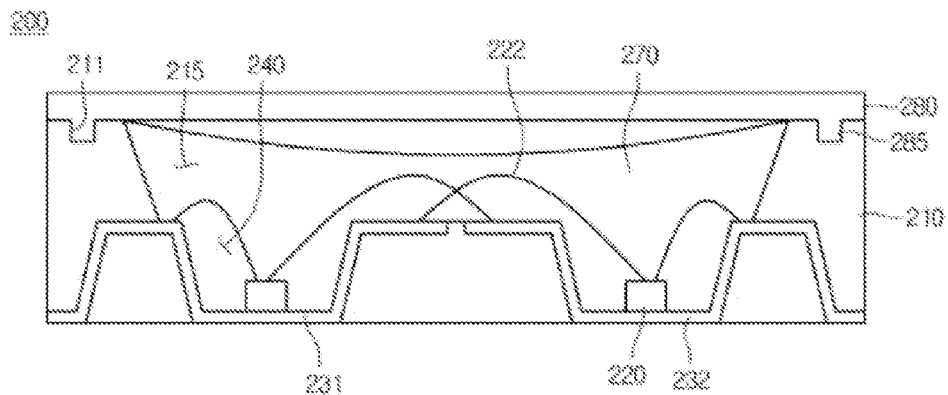
FIG. 7 is a sectional view taken along line I-I' of the light emitting device package shown in FIG. 6.

Referring to FIGS. 6 and 7, a light emitting device package 200 includes a body 210, first and second lead frame 231 and 232 having cavities 240, a plurality of light emitting devices 220, and wires 222.

The body 210 may include at least one of resin material, such as polyphthalamide (PPA), silicon (Si), metallic material, photosensitive glass (PSG), sapphire (Al2O3), and a printed circuit board (PCB). Preferably, the body 210 may include the resin material such as PPA.

The body 210 may include a conductor having electrical conductivity. If the body 210 includes the conductor having electrical conductivity, an insulating layer (not shown) may be formed on the surface of the body 210 to prevent the body 210 from being electrically shorted with the first and second lead frames 231 and 232. When viewed in a plan view, the body 210 may have various shapes, such as a triangular shape, a rectangular shape, a polygonal shape, and a circular shape according to the use and the design of the light emitting device package 200.

The body 210 is provided at an upper portion thereof with an open region 215 to discharge light.

The first lead frame 231 includes the cavity 240. The cavity 240 has a shape recessed from a top surface of the second lead frame 231, for example, a cup shape or a recess shape. The lateral side of the cavity 240 may be inclined with respect to the bottom surface of the cavity 240 or may be perpendicularly bent with respect to the bottom surface of the cavity 240.

The second lead frame 232 includes the cavity 240, and has the same structure as the first lead frame 231.

The cavities 240 of the first and second lead frames 231 and 232 are provided below the open region 215.

At least one light emitting device 220 is provided in the cavity 240. The light emitting device 220 is attached to the bottom surface of the cavity 240. The light emitting device 220 is connected to the first and second lead frames 231 and 232 by the wires 222, respectively. The light emitting device 220 may selectively emit light having the wavelength in the range of an ultraviolet wavelength band to a visible wavelength band. The light emitting device 220 may emit lights having the same peak wavelength, or different peak wavelengths. The light emitting device 220 may include at least one of LED chips employing group III-V compound semiconductors, for example, an ultraviolet (UV) LED chip, a blue LED chip, a green LED chip, a white LED chip, and a red LED chip.

The bottom surfaces of the first and second lead frames 231 and 232 are provided on the bottom surface of the body 210. The bottom surfaces of the first and second lead frames 231 and 232 are connected to a pad provided on a board through a connection member such as a solder and serve as heat dissipation plates.

As shown in FIGS. 6 and 7, the resin member 270 is formed to cover the cavity 240.

The resin member 270 may be formed by dispensing transmissive materials, but the embodiment is not limited thereto.

A fluorescence sheet 280 is coupled with a top surface of the body 210.

The fluorescence sheet 280 has a structure in which fluorescence materials are distributed in transmissive resin. The fluorescence materials change the wavelength of light emitted from the light emitting device 220 to emit light having a wavelength different from a wavelength of the light emitted from the light emitting device 220.

Therefore, the light emitted from the light emitting device 220 is mixed with the light emitted from the fluorescence material, so that the light having a specific chromaticity coordinate may be generated. If the chromaticity coordinate coincides with the target coordinate, a product is regarded as a normal product.

For example, when the light emitting device 220 is a blue light emitting diode, and the fluorescence material represents a yellow color, the yellow fluorescence material is excited by the blue light to generate white light. When the light emitting device 220 irradiates an ultraviolet ray, fluorescence materials representing three colors of red, green, and blue are added to the fluorescence sheet 280 to generate white light.

The fluorescence sheet 280 may include a sheet protrusion 285 protruding toward the top surface of the body 210 and the body 210 is formed on the top surface thereof with a protrusion slot 211 coupled with the sheet protrusion 285.

Referring to FIG. 7, the sheet protrusion 285 and the protrusion slot 211 have the shape corresponding to the shape of the body 210 and surround over the whole area of the body 210. Thus, if the body 210 has a rectangular shape, the sheet protrusion 285 and the protrusion slot 211 may form a rectangular closed loop. However, according to another embodiment, a plurality of sheet protrusions 285 separated from each other and a plurality of protrusion slots 211 to receive the sheet protrusions 285 can be provided.

The fluorescence sheet 280 may include elastic resin and may be coupled with the body 210 as the sheet protrusion 285 is fitted into the protrusion slot 211.

In this manner, since the fluorescence sheet 280 can be fitted into the body 210 in such a manner that the fluorescence sheet 280 can be separated from the body 210, if it is determined in the chromaticity coordinate test that the chromaticity coordinate deviates from the predetermined range, the chromaticity coordinate can be corrected by replacing the fluorescence sheet 280 with another fluorescence sheet 280.

Although FIG. 7 shows the fluorescence sheet 280 having the protrusion, the embodiment is not limited thereto. For example, the fluorescence sheet 280 may have the slot to receive the protrusion as shown in FIG. 4, or the fluorescence sheet 280 may be slidably coupled with the body 210 as shown in FIG. 5.

Figure 8:
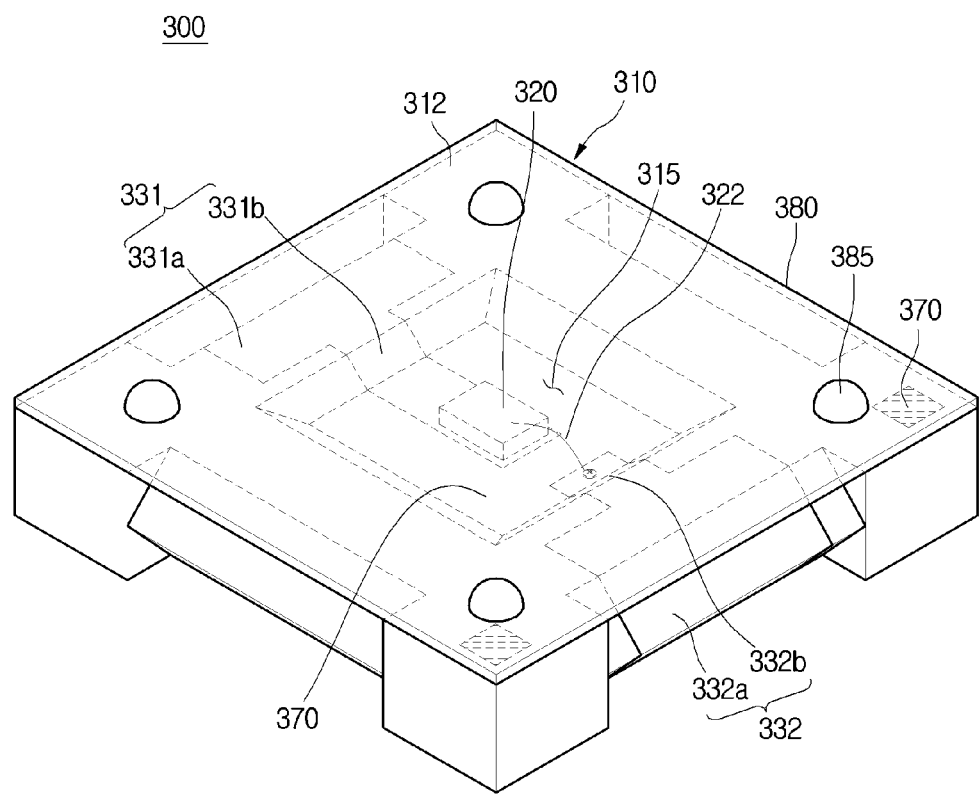
FIG. 8 is a perspective view showing a light emitting device package according to the fifth embodiment.
Figure 9:
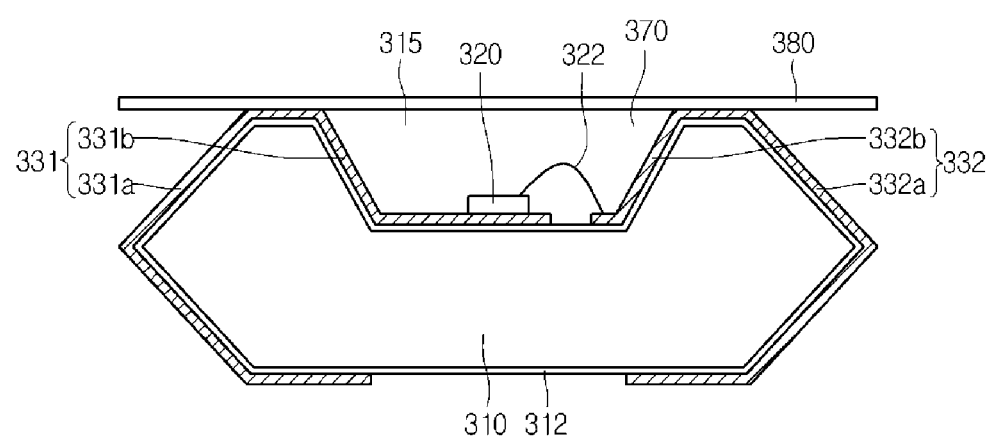
FIG. 9 is a sectional view taken along line I-I' of the light emitting device package shown in FIG. 8.

Referring to FIGS. 8 and 9, a light emitting device package 300 includes a body 310, an insulating layer 312 including silicon oxide ($Si_xO_y$) and formed on the surface of the body 310, at least one light emitting diode 320 provided on the body 310, and first and second electrodes 331 and 332 provided on the body 310 and electrically connected to the light emitting diode 320.

In addition, the light emitting device package 300 may include a fluorescence film 380 to protect the light emitting diode 320.

The body 310 may include a silicon (Si) body manufactured through a wafer level package (WLP), in which a cavity 315 is formed in a silicon wafer and the light emitting diode 320 is packaged by installing the light emitting diode 320 in the cavity 315.

The cavity 315 may be formed in the body 310 such that an upper portion of the body 310 can be open. For example, the cavity 315 may be formed through injection molding or etching.

The cavity 315 may have the shape of a cup or a concave vessel. The inner lateral side of the cavity 315 may be perpendicular to a bottom surface of the cavity 315 or may be inclined with respect to the bottom surface of the cavity 315. If the inclined surface is formed by performing a wet etching process with respect to the body 310 including silicon (Si), the inclined surface may have an angle of about 50° to about 60°.

In addition, when viewed in a plan view, the cavity 315 may have a circular shape, a rectangular shape, a polygonal shape, or an oval shape.

An insulating layer 312 may be formed on the surface of the body 310.

The insulating layer 312 prevents the body 310 from being electrically shorted with the first and second electrodes 331 and 332 caused by the external power.

For example, the insulating layer 312 may include at least one selected from the group consisting of $SiO_2$, $Si_xO_y$, $Si_3N_4$, $Si_xN_y$, $SiO_xN_y$, and $Al_2O_3$. Preferably, the insulating layer 312 may include silicon oxide ($SiO_2$, $Si_xO_y$), but the embodiment is not limited thereto.

If the body 310 is made of Si, the insulating layer 312 may be provided in the form of a silicon oxide film through a thermal oxidation scheme. In addition, the insulating layer 312 may be deposited through a sputtering scheme, a PECVD (Plasma Enhanced Chemical Vapor Deposition) scheme, or an electronic-beam deposition scheme, but the embodiment is not limited thereto.

In addition, the insulating layer 312 may be formed on the whole surface of the body 310, or may be formed on at least a region where the first and second electrodes 331 and 332 are formed. However, the embodiment is not limited thereto.

The first and second electrodes 331 and 332 may be formed on the insulating layer 312. The first and second electrodes 331 and 332 may be electrically divided into an anode and a cathode to supply power to the light emitting diode 320. Meanwhile, in addition to the first and second electrodes 331 and 332, a plurality of electrodes may be formed according to the design of the light emitting diode 320, but the embodiment is not limited thereto.

The first and second electrodes 331 and 332 may be formed in an etched area of the body 310 after etching the top surface of the body 310, so that the first and second electrodes 331 and 332 may be aligned on the same plane with the body 310 without the step difference. Thus, the first and second electrodes 331 and 332 adhere to the fluorescence film 380 and the top surface of the body 310 without being delaminated, so that the cavity 315 can be kept in the airtight state. In addition, the first and second electrodes 331 and 332 may have the multi-layer structure. For example, the first and second electrodes 331 and 332 may include a Ti/Cu/Ni/Au layer formed by sequentially laminating titanium (Ti), copper (Cu), nickel (Ni), and gold (Au), but the embodiment is not limited thereto.

In other words, material, such as Ti, Cr, or Ta, representing superior adhesive strength with respect to the insulating layer 312 is laminated on the lowermost layer of the first and second electrodes 331 and 332, material, such as Au, which is readily attached to a wire and the like and represents superior electrical conductivity, is laminated on the uppermost layer of the first and second electrodes 331 and 332, and a diffusion barrier layer including Pt, Ni, or Cu is laminated between the uppermost layer and the lowermost layer of the first and second electrodes 331 and 332. However, the embodiment is not limited thereto.

The first and second electrodes 331 and 332 may be selectively formed through a plating scheme, a deposition scheme, or photolithography, but the embodiment is not limited thereto.

In addition, the first and second electrodes 331 and 332 may include electrode body parts 331a and 332a and extension parts 331b and 332b protruding from the electrode body parts 331a and 332a, respectively. Widths of the extension parts 331b and 332b may be smaller than widths of the electrode body parts 331a and 332a, and only the extension parts 331b and 332b may be provided in the cavity 315 of the body 310. In addition, a wire 332 serving as a conductive connection member is bonded to the extension part 332b, so that the first and second electrodes 331 and 332 can be electrically connected to the light emitting diode 320.

Meanwhile, as shown in FIGS. 8 and 9, a cathode mark may be formed on the body 310 in order to distinguish the first and second electrodes 331 and 332 from each other. However, the embodiment is not limited thereto.

A reflective layer (not shown) may be formed on the insulating layer 312 and the first and second electrodes 331 and 332 on the body 310.

The light emitting diode 320 may be mounted on the body 310. If the body 310 includes the cavity 315, the light emitting diode 320 may be mounted in the cavity 315.

At least one light emitting diode 320 may be provided on the body 310 according to the design of the light emitting device package 300. If a plurality of light emitting devices 320 are mounted on the body 320, a plurality of electrodes and reflective layers may be formed to supply power to the light emitting device packages 300, but the embodiment is not limited thereto.

The light emitting diode 320 may be directly mounted on the body 310, or electrically bonded onto the first and second electrodes 331 and 332.

The light emitting diode 320 is a UV light emitting diode for emitting light having a wavelength in the range of 245 nm to 405 nm. That is, the light emitting diode 320 may emit the light having the short wavelength of about 2380 nm or the long wavelength of about 365 nm or 385 nm.

The light emitting diode 320 may be mounted by selectively using a wire bonding scheme, a die bonding scheme, or a flip bonding scheme. The bonding scheme may vary according to the types of a chip and the positions of electrodes of the chip.

The light emitting diode 320 may selectively include a semiconductor light emitting device manufactured by using group III-V compound semiconductors, such as AlInGaN, InGaN, GaN, GaAs, InGaP, AlInGaP, InP, and InGaAs.

The fluorescence film 380 has a structure in which fluorescence materials are distributed in transmissive resin. The fluorescence materials change the wavelength of light emitted from the light emitting diode 320 to emit light having a wavelength different from a wavelength of the light emitted from the light emitting diode 320.

Therefore, the light emitted from the light emitting diode 320 is mixed with the light emitted from the fluorescence material, so that the light having a specific chromaticity coordinate may be generated. If the chromaticity coordinate coincides with the target coordinate, a product is regarded as a normal product.

Referring to FIGS. 8 and 9, the body 310 is coupled with the fluorescence film 380 by coupling pins 385.

The coupling pins 365 may have the screw structure, but the embodiment is not limited thereto. In addition, the body 310 can be coupled with the fluorescence film 380 by using fitting protrusions or the fluorescence film 380 can be slidably coupled with the body 310.

The light emitting device package according to the embodiment is applicable to a light unit. The lighting unit includes a structure in which a plurality of light emitting device packages are arrayed. The light unit includes a display device shown in FIG. 10 and a lighting device shown in FIG. 11, and is applicable to a unit such as a lighting lamp, a signal lamp, a headlight of a vehicle, an electric signboard, and an indicator.

Figure 10:
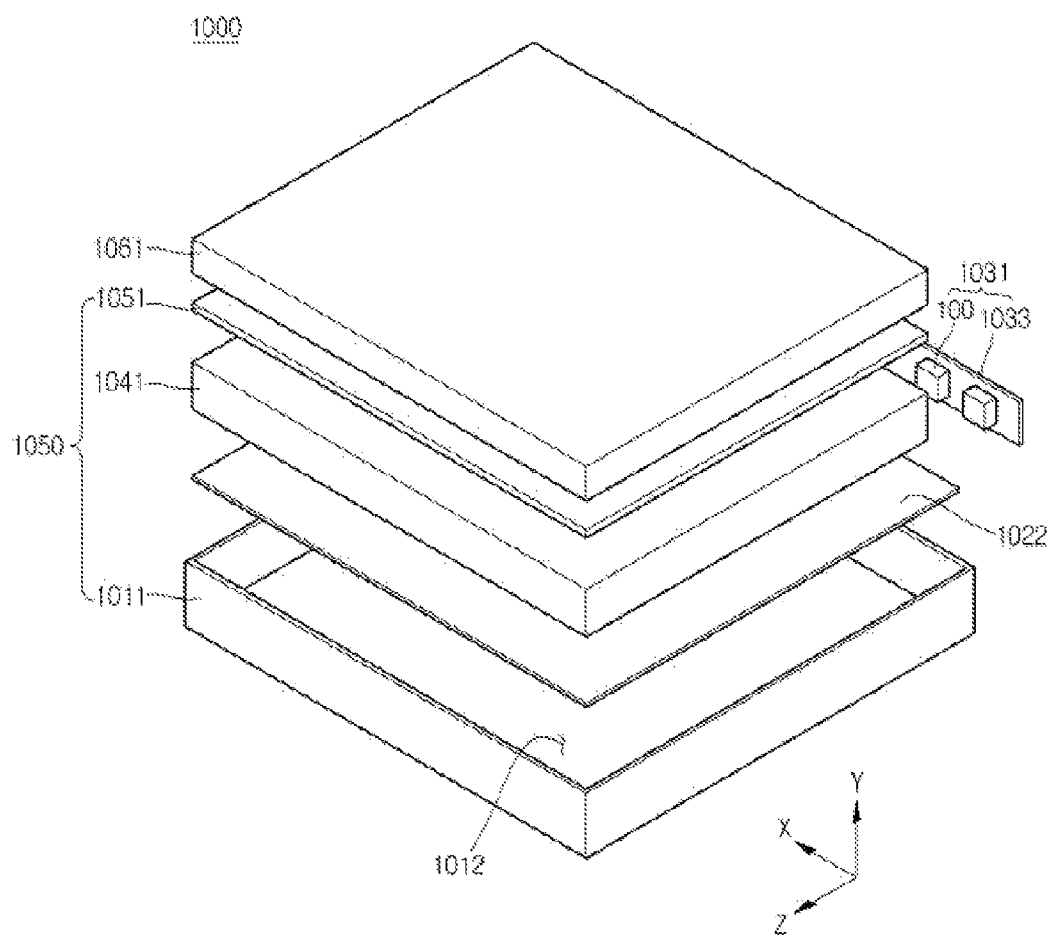
FIG. 10 is an exploded perspective view showing the display device including the light emitting device package according to the embodiment.

FIG. 10 is an exploded perspective view showing a display device 1000 according to the embodiment.

Referring to FIG. 10, the display device 1000 includes a light guide plate 1041, a light emitting module 1031 to supply a light to the light guide plate 1041, a reflective member 1022 provided under the light guide plate 1041, an optical sheet 1051 provided above the light guide plate 1041, a display panel 1051 provided above the optical sheet 1051, and a bottom cover 1011 to receive the light guide plate 1041, the light emitting module 1031, and the reflective plate 1022, but the embodiment is not limited thereto.

The bottom cover 1011, the reflective plate 1022, the light guide plate 1041, and the optical sheet 1051 may constitute a light unit 1050.

The light guide plate 1041 diffuses light, which is supplied from the light emitting module 1031, to supply surface light. The light guide plate 1041 includes a transparent material. For example, the light guide plate 1041 may include one selected from the group consisting of acryl-based resin, such as PMMA (polymethyl methacrylate), PET (polyethylene terephthalate), PC (polycarbonate), COC (cycloolefin copolymer) and PEN (polyethylene naphthalate) resin.

The light emitting module 1031 is provided on at least one lateral side of the light guide plate 1041 to supply the light to the at least one lateral side of the light guide plate 1041. Accordingly, the light emitting module 1031 serves as a light source of the display device 1000.

At least one light emitting module 1031 is provided to directly or indirectly supply the light to one lateral side of the light guide plate 1041. The light emitting module 1031 includes a substrate 1033 and the disclosed light emitting device package 100 according to the embodiment. The light emitting device package 100 may be arrayed on the substrate 1033 at a predetermined interval. The substrate 1033 may include a printed circuit board, but the embodiment is not limited thereto. In addition, the substrate 1033 may include a metal core PCB (Metal Core PCB), or a flexible PCB (FPCB), but the embodiment is not limited thereto. If the light emitting device package 100 is mounted on the lateral side of the bottom cover 1011 or on a heat dissipation plate, the substrate 1033 may be omitted. The heat dissipation plate may partially make contact with the top surface of the bottom cover 1011. Therefore, heat generated from the light emitting device package 100 may be discharged to the bottom cover 1011 through the heat dissipation plate.

The light emitting device packages 100 are provided on the substrate 1033 such that light exit surfaces to discharge light are spaced apart from the light guide plate 1041 by a predetermined distance, but the embodiment is not limited thereto. The light emitting device packages 100 can directly or indirectly supply light to a light incidence part which is one lateral side of the light guide plate 1041, but the embodiment is not limited thereto.

The reflective member 1022 may be provided under the light guide plate 1041. The reflective plate 1022 reflects a light, which is incident from the bottom surface of the light guide plate 1041, upward to supply the light to the display panel 1061, so that the brightness of the display panel 1061 can be improved. The reflective member 1022 may include PET, PC, or PVC resin, but the embodiment is not limited thereto. The reflective member 1022 may serve as a top surface of the bottom cover 1011, but the embodiment is not limited thereto.

The bottom cover 1011 may receive the light guide plate 1041, the light emitting module 1031, and the reflective member 1022. To this end, the bottom cover 1011 may include a receiving part 1012 having the shape of a box with an open upper portion, but the embodiment is not limited thereto. The bottom cover 1011 may be coupled with a top cover (not shown), but the embodiment is not limited thereto.

The bottom cover 101 may include a metallic material or a resin material, and may be manufactured through a pressing process or an extruding process. The bottom cover 1011 may include a metallic material or a non-metallic material representing superior thermal conductivity, but the embodiment is not limited thereto.

The display panel 1061, for instance, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing a light to pass through the light emitting module 1031 or blocking the light. The display device 1000 is applicable to various portable terminals, a monitor of a laptop computer or a notebook computer, or an image display device such as a television.

The optical sheet 1051 is interposed between the display panel 1061 and the light guide plate 1041, and includes at least one transmissive sheet. The optical sheet 1051 may include at least one of a diffusion sheet, a horizontal/vertical prism sheet, and a brightness enhanced film. The diffusion sheet diffuses the incident light, the horizontal/vertical prism sheet concentrates the incident light onto the display panel 1061, and the brightness enhanced sheet improves the brightness of light by reusing the wasted light. In addition, a protective sheet may be provided on the display panel 1061, but the embodiment is not limited thereto.

The light guide plate 1041 and the optical sheet 1051 serving as optical members may be provided in the optical path of the light emitting module 1031, but the embodiment is not limited thereto.

Figure 11:
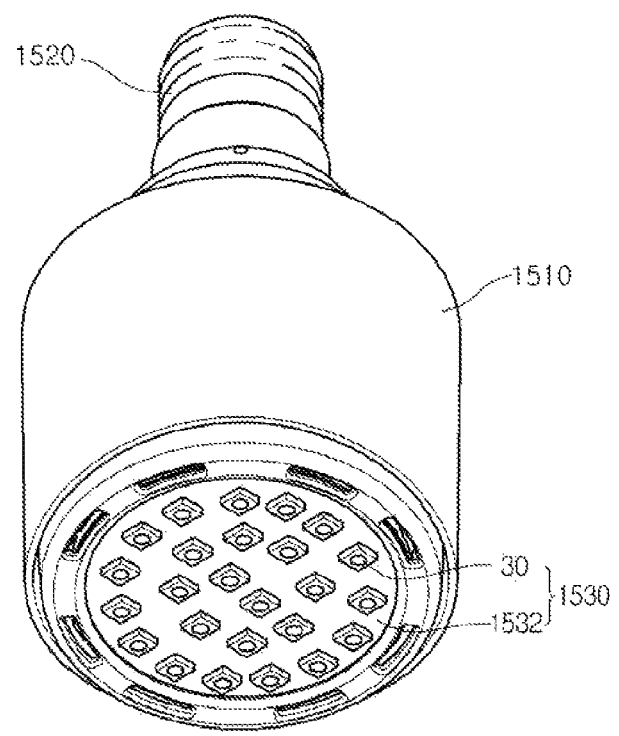
FIG. 11 is a perspective view showing a lighting device including the light emitting device package according to the embodiment.

FIG. 11 is a perspective view showing a lighting device 1500 according to the embodiment.

Referring to FIG. 11, the lighting device 1500 includes a case 1510, a light emitting module 1530 installed in the case 1510, an optical member on the optical path of the light emitting module 1031, and a connection terminal 1520 installed in the case 1510 to receive power from an external power source.

Preferably, the case 1510 includes material having a superior heat dissipation property. For instance, the case 1510 includes metallic material or resin material.

The light emitting module 1530 may include a substrate 1532 and light emitting device packages 100 according to the embodiment installed on the substrate 1532. The light emitting device packages 100 are spaced apart from each other or arrayed in the form of a matrix.

The substrate 1532 may include an insulating member printed with a circuit pattern. For instance, the substrate 1532 includes a PCB, an MCPCB, an FPCB, a ceramic PCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one light emitting device package 100 is installed on the substrate 1532. Each light emitting device package 100 may include at least one LED (light emitting diode) chip. The LED chip may include an LED that emits the light of visible ray band having red, green, blue or white color and a UV (ultraviolet) LED that emits UV light.

The light emitting device packages 100 of the light emitting module 1530 may be variously arranged to provide various colors and brightness. For example, the white LED, the red LED and the green LED can be arranged to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For example, the connection terminal 1520 can be prepared in the form of a pin inserted into the external power source or connected to the external power source through a wire.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a body having a cavity, an upper portion and a lower portion;
at least one light emitting device in the cavity;
a resin member filled in the cavity while covering the light emitting device;
a fluorescence sheet disposed on the cavity and the upper portion of the body;
fixing members formed at an outer peripheral region of a surface of the upper portion of the body; and
slots formed between the fixing members and an upper surface of the upper portion of the body,
wherein a portion of the fluorescence sheet is inserted into the slots and the portion of the fluorescence sheet is overlapped with a portion of the fixing member.

2. The light emitting device package of claim 1, wherein the fixing members are positioned at opposite lateral sides of the upper portion of the body.

3. The light emitting device package of claim 1, further comprising first and second electrodes exposed on a surface of the lower portion of the body.

4. The light emitting device package of claim 1, wherein the fluorescence sheet has a thickness in a range of 80 μm to 100 μm.

5. The light emitting device package of claim 1, wherein the resin member is a transmissive resin.

6. The light emitting device package of claim 1, wherein a space is formed between the resin member and the fluorescence sheet.

7. The light emitting device package of claim 6, wherein a height of the resin member is gradually reduced from an outer peripheral region of the cavity to a center region of the cavity.

8. The light emitting device package of claim 6, wherein a maximum length of the space is in a range of 50 μm to 60 μm.

9. The light emitting device package of claim 1, wherein the fixing members, the upper portion of the body and the lower portion of the body are formed of a single body.

10. The light emitting device package of claim 1, wherein a height of the slots is equal to a thickness of the fluorescence sheet.

11. The light emitting device package of claim 6, a width of the upper portion of the body is wider than a width of the fluorescence sheet.

12. The light emitting device package of claim 3, wherein the first and second electrodes are disposed between the upper portion of the body and the lower portion of the body.

13. The light emitting device package of claim 3, wherein the first and second electrodes extend to a bottom surface of the lower portion of the body while surrounding a lateral side of the lower portion of the body.

14. The light emitting device package of claim 3, wherein the first and second electrodes are formed in a multi-layer structure including a plurality of metal layers.

15. The light emitting device package of claim 1, wherein the fluorescence sheet includes a fluorescence material.

16. The light emitting device package of claim 1, wherein an inner lateral side of the upper portion of the body has an inclination angle of 50° to 60° about the surface of the lower portion of the body.

17. The light emitting device package of claim 1, wherein outer peripheral portions of the resin member contact an inner lateral side of the upper portion of the body and a bottom surface of the fluorescence sheet in the cavity.

18. The light emitting device package of claim 1, wherein a top surface of the fixing member is higher than a top surface of the fluorescence sheet.

19. The light emitting device package of claim 3, wherein a reflective layer is disposed on the first and second electrodes.

20. A light emitting device package comprising:
a body having a cavity, an upper portion and a lower portion;
at least one light emitting device in the cavity;
a resin member filled in the cavity and covering the at least one light emitting device;
a fluorescence sheet disposed on the cavity and the upper portion of the body;
fixing members formed at an outer peripheral region of a surface of the upper portion of the body; and
slots formed under the fixing members and on an upper surface of the upper portion of the body,
wherein a portion of the fluorescence sheet is inserted into the slots.

* * * * *